US006694462B1

(12) United States Patent
Reiss et al.

(10) Patent No.: US 6,694,462 B1
(45) Date of Patent: Feb. 17, 2004

(54) CAPTURING AND EVALUATING HIGH SPEED DATA STREAMS

(75) Inventors: Alan J. Reiss, Wayland, MA (US); Gordon B. Saksena, Newton, MA (US)

(73) Assignee: Teradyne, Inc., Boston, MA (US)

(*) Notice: Subject to any disclaimer, the term of this patent is extended or adjusted under 35 U.S.C. 154(b) by 519 days.

(21) Appl. No.: 09/635,334

(22) Filed: Aug. 9, 2000

(51) Int. Cl.$^7$ .............................. G01R 31/28; G06F 7/02
(52) U.S. Cl. ...................................... 714/724; 714/819
(58) Field of Search .............................. 714/724, 731, 714/744, 797, 824, 703, 819, 799

(56) References Cited

U.S. PATENT DOCUMENTS

| 4,354,177 A | | 10/1982 | Sloane ........................ 340/347 |
| 5,737,342 A | * | 4/1998 | Ziperovich .................. 714/736 |
| 6,260,166 B1 | * | 7/2001 | Bhavsar et al. ............. 714/727 |
| 6,324,224 B1 | * | 11/2001 | Ikeda .......................... 375/341 |
| 6,331,999 B1 | * | 12/2001 | Ducaroir et al. ............ 375/226 |
| 6,536,005 B1 | * | 3/2003 | Augarten .................... 714/723 |

FOREIGN PATENT DOCUMENTS

| EP | 0518116 | 12/1992 | ........... G01R/19/25 |
| WO | WO 99/51941 | 10/1999 | ............ G01D/1/02 |

OTHER PUBLICATIONS

A CMOS high–speed data recovery circuit using the matched delay sampling technique Jin–Ku Kang; Wentai Liu; Cavin, R.K., I IEEE Journal of Solid–State Circuits, vol.: 32 Issue: 10, Oct. 1997 Page(s): 1588–1596.*
Alan J. Reiss, Edge Find 1999, Apr. 12, 1999, Teradyne, Inc.
Time Jitter Digitizer, Version 6.4, Jun., 1999, Teradyne, Inc.
"Statistical Analysis with Messy Data" Gordon B. Saksena, Teradyne, Inc., Mar. 28, 2000.
"Optimizing Edgefinds" Gordon B. Saksena, Teradyne, Inc., 1998.

* cited by examiner

Primary Examiner—Albert Decady
Assistant Examiner—Cynthia Britt
(74) Attorney, Agent, or Firm—Bruce D. Rubenstein

(57) ABSTRACT

A system and method for capturing and evaluating high-speed serial data streams using conventional component testers includes a high-speed latching comparator coupled to the output of a device under test (DUT). The component tester stimulates the DUT to produce a high-speed serial data stream and strobes the latching comparator at predetermined instants of time relative to the serial data stream. In response, the latching comparator samples the digital state of the serial data stream and holds the sampled state. The component tester reads and stores the held state. The tester samples the serial data stream at multiple locations in this fashion, and takes multiple samples at each location. The tester averages the samples acquired at each location to render a probability function of the serial data stream verses time. The probability function has values that vary between zero and one, corresponding to the average value of the digital readings sampled at each point. From the probability function, significant timing characteristics of the serial data stream can be deduced, for example, jitter, intersymbol interference, and eye closure.

20 Claims, 4 Drawing Sheets

CAPTURING AND EVALUATING HIGH SPEED DATA STREAMS

This invention relates generally to automatic test equipment, and more particularly to testing the timing characteristics of high-speed, serial data streams.

BACKGROUND OF THE INVENTION

Manufacturers of integrated circuits use automatic test equipment (ATE) to verify newly manufactured devices. ATE allows manufacturers to diagnose device faults early in the manufacturing process, and thus allows manufacturers to save costs. ATE also allows manufacturers to grade devices across different levels of performance. As manufacturers generally receive higher prices for better-performing chips, the ability to accurately test integrated circuits translates into increased profits.

A primary goal of automatic test equipment (ATE) is to test electronic devices quickly and accurately. As devices become faster and more complex, ATE must advance to keep pace with these changes.

The popularity of Serializer/Deserializer transceivers, commonly called "SerDes" devices, has increased with recent growth in the telecommunications and networking industries. SerDes devices convert parallel bit streams into serial bit streams that change at a multiple of the input, parallel data rate. They also perform the reverse function of deserializing serial bit streams, by converting them into parallel bit streams that change at a fraction of the serial data rates. SerDes devices are now available at serial data rates up to 2.5 GB/s (billion bits per second), and 10 GB/s parts will soon be available.

FIG. 1 is a highly simplified illustration of a conventional component tester 100. The component tester 100 includes a host computer 110, a timing generator 112, a memory 114, and a system clock 116. The host computer 110 stores a test program (not shown) for controlling the resources of the component tester 100. In response to the system clock 116, the timing generator 112 produces timing signals 118 at precise instants in time defined by the test program. The timing signals 118 control a plurality of driver circuits, shown generally as driver circuits 120a–120x, and a plurality of detector circuits, shown generally as detector circuits 122a–122x.

The test program specifies data representative of digital states to which the driver circuits 120 are to be driven. These data are conventionally known as "drive data." The test program also specifies data representative of values expected from the DUT in response to the drive data, i.e., "expect data." The test system 100 stores the drive data in the memory 114, and sequentially applies the drive data to the driver circuits 120 at precise instants in time. In response, the driver circuits 120 generate electrical signals. The electrical signals are applied to inputs of a DUT (device under test) 124, and the DUT 124 generates outputs in response to its inputs. As the test system 100 applies input signals to the DUT 124, it simultaneously causes the detector circuits 122 to strobe output signals from the DUT. Data representative of signals captured by the detector circuits are stored in the memory 114. To determine whether a device passes or fails, the test program compares the captured data from the detector circuits 122 with the expect data. If the actual data matches the expect data, the test program generally passes. Otherwise, the test program generally fails.

State-of-the-art component testers can generate digital waveforms at speeds up to several hundred megahertz. This still falls short of the 10 GB/s needed to directly test the fastest currently available SerDes devices at full speed.

Previous attempts at measuring high-speed serial data streams with component testers have made use of specialized instruments called TJD's (Time Jitter Digitizers). TJD's detect events at their inputs—for example, electrical signals changing state—and apply time-stamp values indicative of the times at which the detected events occur. For testing serial data streams, a TJD captures the serial data stream. A tester then reads back events and corresponding time-stamp values to accurately report the timing of edges embedded within the serial data stream. Because they are complex, multifunctional instruments, TJD's tend to be expensive. They also tend to operate at speeds that are slower than those required for testing the fastest SerDes devices.

SUMMARY OF THE INVENTION

With the foregoing background in mind, it is an object of the invention to measure the timing characteristics of high-speed serial data streams.

It is a further object of the invention to readily integrate with conventional automatic test equipment.

To achieve the foregoing objects and other objectives and advantages, a conventional test system is provided with a latching comparator to facilitate the testing of a device under test (DUT). The latching comparator has a Latch Enable input, which, when activated, causes the latching comparator to hold at its output the binary state of its input at the instant of activation. Driver circuits from the tester are coupled to inputs of the DUT, and the output of the DUT is coupled to the input of the latching comparator. Under control of a test program, the tester applies a test pattern to the inputs of the DUT. The DUT in turn generates an output signal. At a precisely controlled instant in time relative to the DUT output signal, the tester activates the Latch Enable input and samples the output of the latching comparator. The tester repetitively applies the test pattern and activates the Latch Enable input, to acquire a plurality of samples of the DUT output signal at the controlled instant in time relative to the DUT output signal.

The timing for activating the Latch Enable input is then changed to correspond to a different location relative to the DUT output signal, and a plurality of samples of the DUT output signal are acquired at the new location. This process of sampling the DUT output signal and changing the timing for activating the Latch Enable input is repeated until a plurality of samples are collected for all desired locations of the DUT output signal.

Using the stored samples, the tester computes a separate average—or probability—of samples acquired for each location relative to the DUT output signal. The averages are then sequenced as a function of time, and the results are analyzed.

Additional objects, advantages, and novel features of the invention will become apparent from a consideration of the ensuing description and drawings.

BRIEF DESCRIPTION OF THE DRAWINGS

The invention can be better understood with reference to the accompanying drawings, in which aspects of the invention and prior art are illustrated as follows.

DESCRIPTION OF THE PREFERRED EMBODIMENT

Topology

Figure 1:
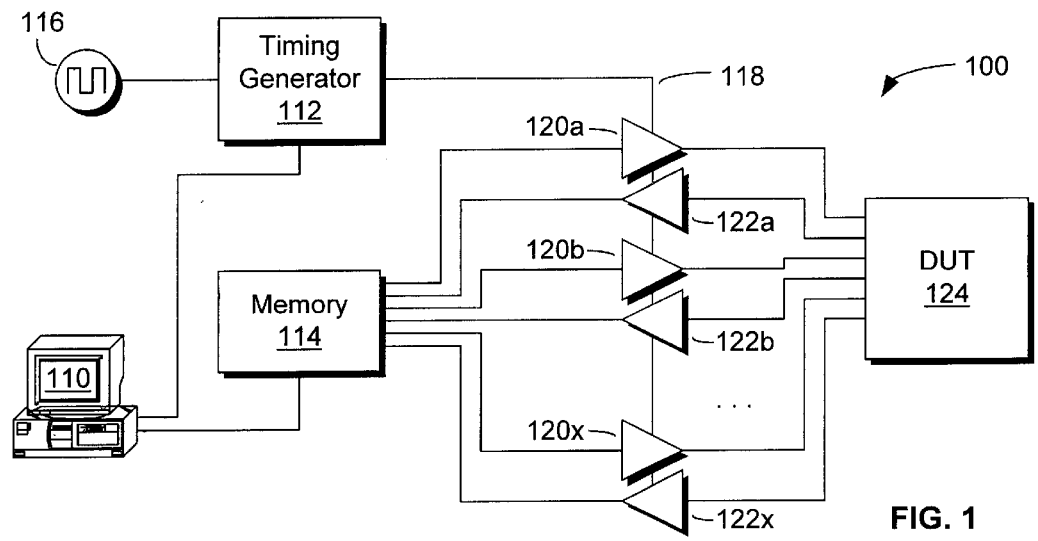
FIG. 1 is a simplified block diagram of the digital portion of a conventional component tester according to the prior art.
Figure 2:
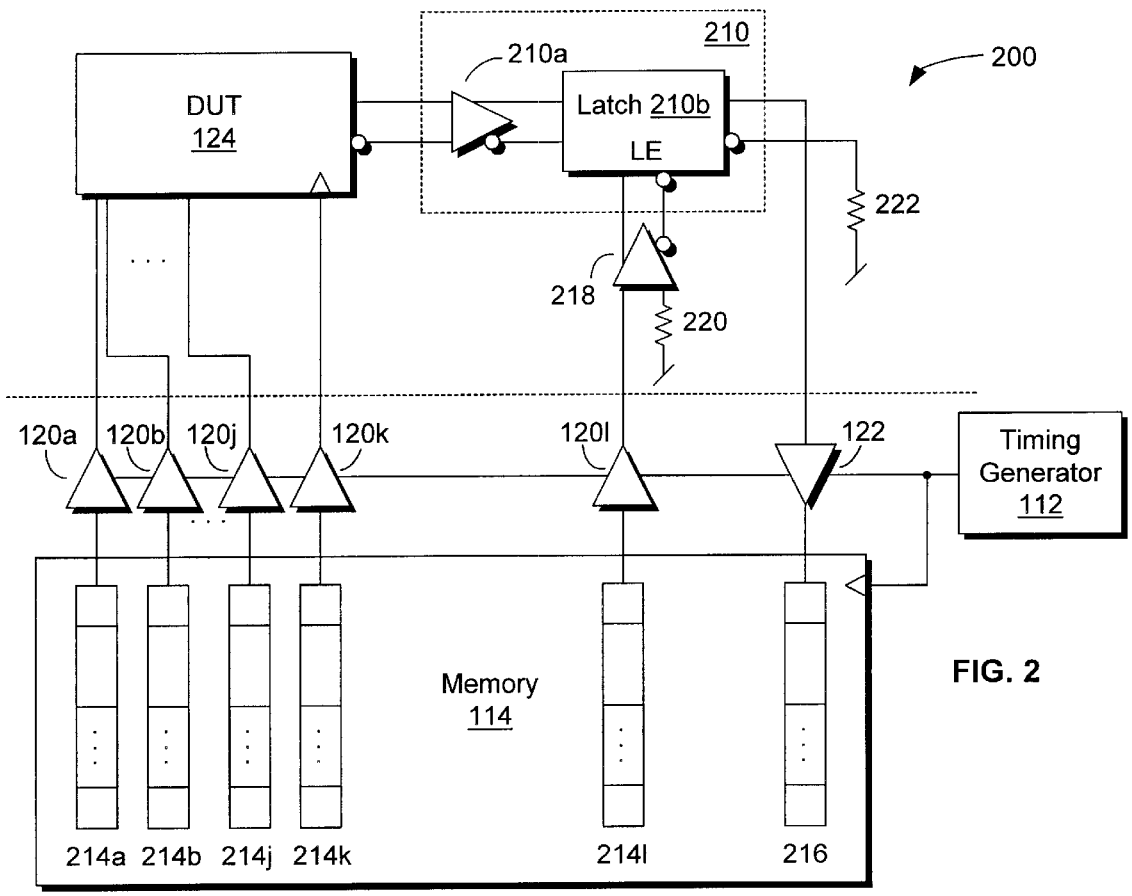
FIG. 2 is a simplified block diagram of a test system adapted in accordance with the invention for characterizing serial data streams.

FIG. 2 is a simplified, partial illustration of a test system 200 constructed in accordance with the invention, for testing a DUT 124. As shown in FIG. 2, the test system 200 includes a memory 114, a timing generator 112, a plurality of driver circuits 120a–120l, and a detector circuit 122. The timing generator 112 produces timing signals 118 that control the timing of the driver circuits and detector circuit. The memory 114 is subdivided into a plurality of segments, each dedicated to a particular driver or detector circuit. For example, memory segments 214a–214l store drive data for the driver circuits 120a–120l, respectively. The memory segment 216 stores response data corresponding to digital signals captured by the detector circuit 122.

The test system 200 according to the invention also includes a latching comparator 210 that includes a comparator portion 210a and a latch portion 210b. The output of the comparator portion 210a is coupled to the input of the latch portion 210b, and the output of the latch portion 210b is coupled to the detector circuit 122, thus allowing it to be sampled by the test system 200. The latching comparator 210 has a Latch Enable (LE) input coupled, via a differential buffer 218, to the output of the driver circuit 120l. When the signal at the LE input (i.e., the "LE signal") is activated, the latching comparator 210 holds at its output whatever digital state is present at its input. The output of the latching comparator 210 remains constant as long as the LE signal remains active, despite changes at the input of the latching comparator, until the LE signal is again activated. When the capital LE signal is inactive, the latch portion 210b is transparent, and the latching comparator respectively generates high and low levels at its output in response to high and low levels at its input.

For testing SerDes devices, the SerDes DUT has a plurality of parallel input terminals, a clock terminal, and a serial output terminal. Driver circuits 120a–120j from the tester 200 provide digital input signals to the parallel input terminals of the DUT 124. Driver circuit 120k provides a clock signal to the clock terminal. In response to these inputs, the SerDes device generates a serial output signal having a data rate equal to N times the frequency of the clock input signal, where N is the number of parallel input signals of the DUT 124. For example, if the SerDes device has 10 parallel input signals—as shown in FIG. 2—and the clock frequency is 250 MHz, the serial output signal would have a data rate of 2.5 GHz.

To adequately measure the 2.5 GHz signal generated by the DUT 124, the comparator portion 210a must be specified to handle frequencies in excess of 2.5 GHz. Similarly, the latch portion 210b must be able to quickly respond to the LE signal without substantial jitter. A suitable device that combines the functionality of a comparator and latch with the needed performance is the SPT 9689 latching comparator from Signal Processing Technologies, Inc., of Colorado Springs, Colo. The SPT 9689 is a differential device, receiving a differential signal at its input and generating a differential signal at its output. The SPT 9689 also receives a differential signal at the LE input.

Latching comparators like the SPT 9689 have been used in the prior art for testing high-speed digital signals in a different context. These devices have been used to implement "edge finders." As is known, edge finders determine whether a digital signal is in a high or low state at a particular instant in time. According to this technique, the input of a latching comparator receives a test signal, and the test signal is made to repeat periodically. The test system strobes the latching comparator by activating its LE input at a precisely controlled instant in time relative to the input signal. Later, the tester reads the held output of the latching comparator to determine whether it is high or low. The tester again strobes the LE input, but at a different instant in time relative to the input signal, and again reads the state of the latching comparator. If the outputs differ between the two readings, then it is certain that an edge of the test signal has occurred during the interval between the first and second strobes. Additional measurements can then be made to hone in on the precise location of the edge.

Operation

Figure 3:
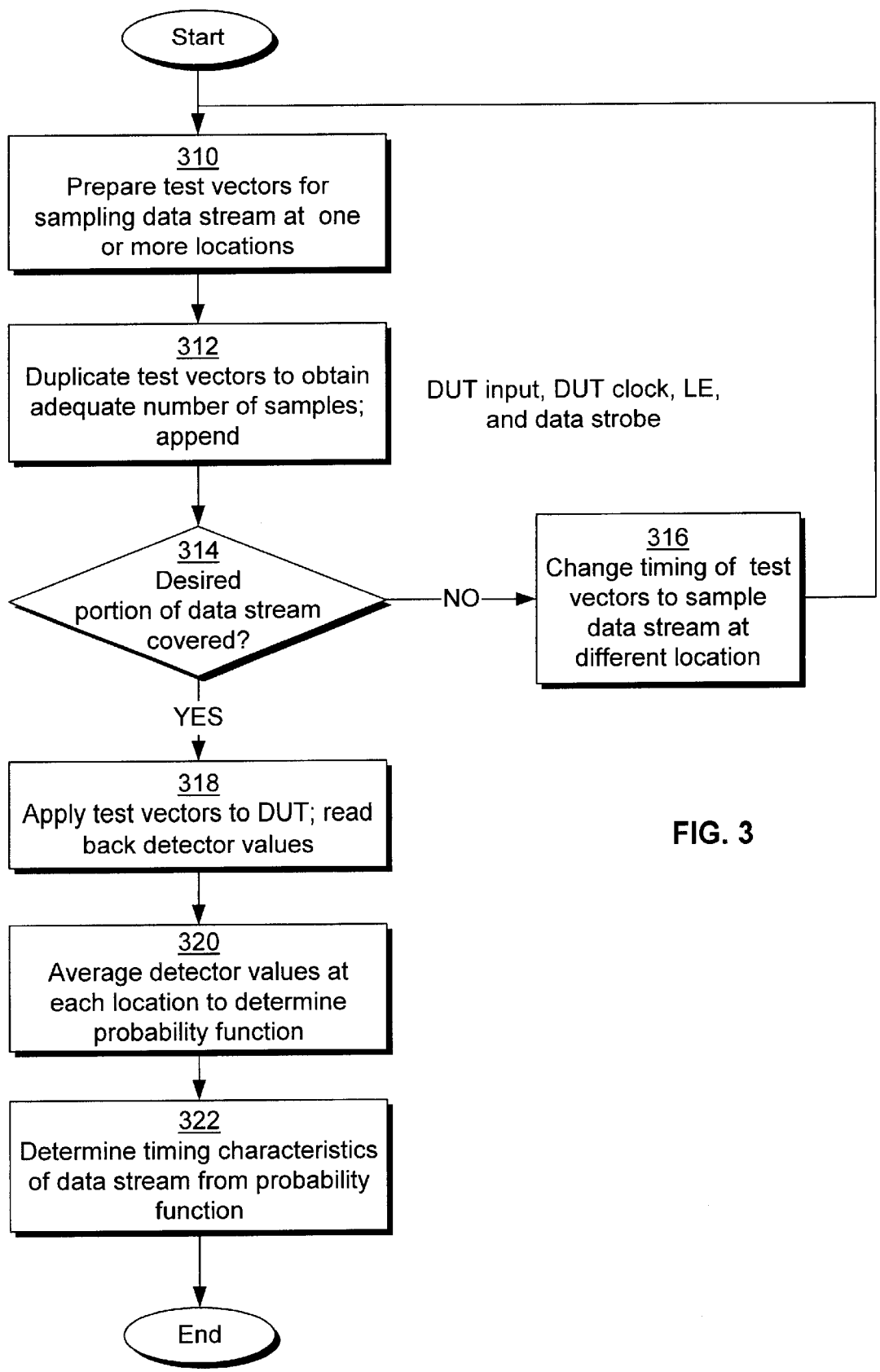
FIG. 3 is a flow chart illustrating a method by which the adapted test system of FIG. 2 can be used for characterizing a serial data stream.

FIG. 3 is a flowchart that illustrates a process for generating and evaluating serial data streams according to the invention. Broadly speaking, the process of FIG. 3 includes steps for preparing test patterns for the SerDes component (steps 310–316), a step for a applying the prepared test patterns (step 318), and steps for analyzing the resulting signals from the device under test (steps 320–322).

At step 310, the test engineer prepares test vectors for applying stimuli to the SerDes component and for sampling the resulting serial data stream at one or more timing locations. Generally, this step includes preparing test patterns for the data input of the SerDes component, for the clock input, and for the LE input. This step also includes preparing test patterns for strobing the output of the latching comparator 210 using a detector (e.g., detector 122).

At step 312, the test vectors generated at step 310 are duplicated for sampling the current sampling location a plurality of times. For instance, in the preferred embodiment test vectors are prepared for sampling each location of the serial data stream 128 times. The duplicated test vectors are then appended to the original test vectors of step 310 to create a record of vectors for acquiring the plurality of samples at each currently defined location of the LE signal.

At step 316, the timing of the LE signal and the detector strobe are changed to sample the serial data stream at a different timing location or locations from those defined at step 310. New test vectors are prepared to reflect the revised timing of the LE and detector strobe signals (step 310). The new test vectors are then duplicated (step 312) to obtain a plurality of samples at the new sample location or locations. Although the timing of test patterns for the LE signal and detector strobe are varied each time through step 314, the patterns for the data and clock of the SerDes component remain constant. Therefore, the patterns for the LE signal and detector strobe effectively "walk through" the fixed, repeating SerDes input.

The process of preparing test vectors, duplicated test vectors, and revising the timing of test vectors is repeated until test vectors for an entire desired portion of the serial data stream have been generated (step 314).

The test vectors are applied to the DUT at step 318. As each test vector is applied, the tester reads back detector values that indicate the state of latching comparator following each assertion of the LE signal. The tester then computes an average of the detector values acquired for each location of the serial data stream (step 320). Each average value represents the probability that the serial data stream has a logic level "1" at the respective sampled location. For example, if 128 samples are taken at a particular location of the serial data stream, half of them being logic level "1" and half being logic level "0," the probability of the serial data stream at that location would be the average value, or 0.5.

At step 322, timing characteristics of the serial data stream are determined from the probability function derived at step 320. This step is described in more detail below. Undersampling/Determining Probability The test system 200 of FIG. 2 characterizes a serial data stream from a SerDes DUT by undersampling the serial data stream and determines the probability (or average) of the serial data stream at each undersampled location. The DUT can then be made to pass or fail depending upon the measured probabilities.

Figure 4A:
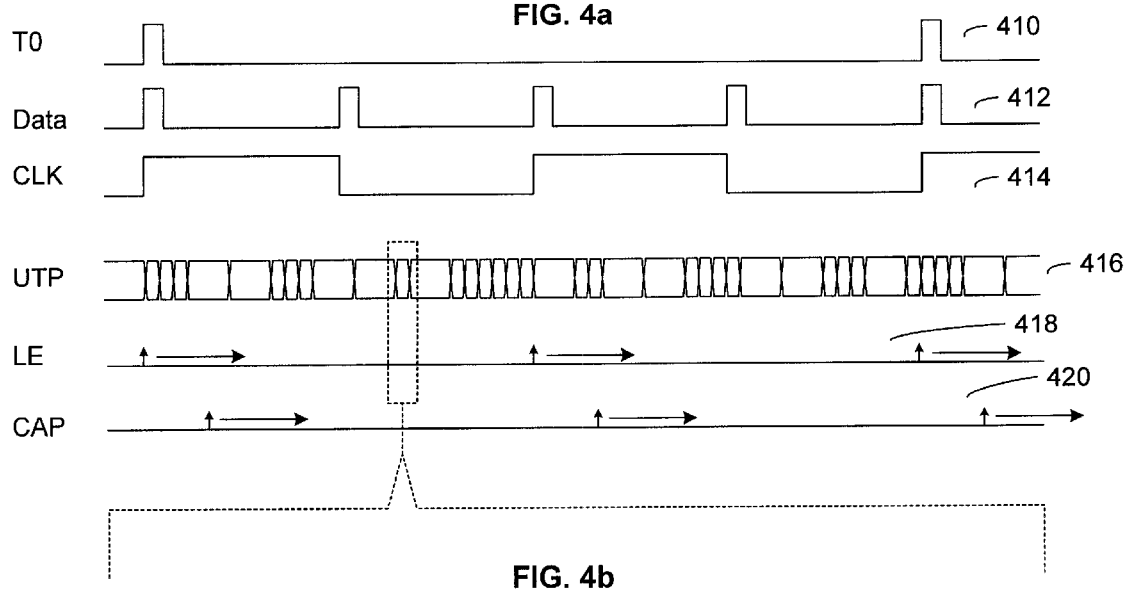
FIG. 4a is a timing diagram of signals used for generating and evaluating a serial data stream by the adapted test system of FIG. 2, during one vector period of the test system.
Figure 4B:
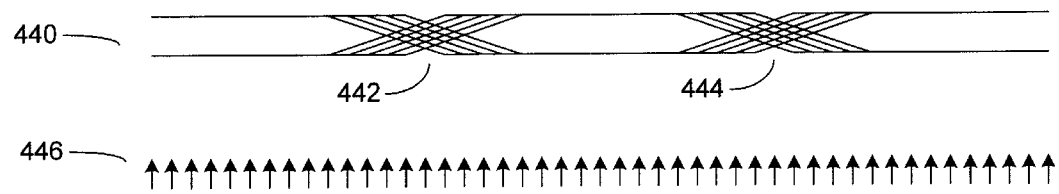
FIG. 4b is an exploded view of a portion of the serial data stream of FIG. 4a, showing instants of time at which the serial data stream is sampled by the adapted test system of FIG. 2.

FIGS. 4a–4b illustrate a process according to the invention for undersampling a serial data stream. In FIG. 4a, the timing activities of the tester 200 are shown during one test vector. Waveform 410 illustrates the "T0" signal, which defines the beginning and end of a test vector. Specifically, the test vector begins at the rising edge of the first pulse of T0 and ends at the rising edge of the second pulse of T0. The tester applies data to the data inputs of the SerDes component during the test vector 410 at intervals shown in waveform 412. The tester is operated a mode that enables it to supply 4 different data words during each vector period. For testing a 10-bit SerDes component, the tester produces 4 different 10-bit data words during each test vector, at the instants designated by the pulses of the waveform 412.

Waveform 414 illustrates the clock signal that the tester provides to the input of the SerDes component. As shown, the clock signal changes at twice the rate of T0. The SerDes component is constructed to respond to both rising and falling edges of the clock signal. Therefore, the SerDes device is clocked four times per test vector, once for each time the data inputs to the SerDes component are changed.

Owing to the operation of the SerDes component, the serial output from the SerDes device has a bit rate equal to 10 times the word rate of the data input signal 412. Since the word rate of the data input signal changes at 4 times the T0 rate, the serial output signal from the SerDes device changes at 40 times the T0 rate.

Waveform 416 illustrates a portion of the serial output signal, which is generated by the SerDes device during the test vector defined by signal 410. As shown, the serial output signal is a differential signal that changes at a rate of 10 times the rate of change of the data signal 412.

It should be understood that the entirety of FIG. 4a is an exploded view that shows only one of many test vectors. In particular, the SerDes specification defines a unit test pattern ("UTP") having a predetermined sequence of 1's and 0's and a predetermined length of 2,280 bits. The test system 200 is preferably programmed to replicate the UTP. As the UTP includes 40 bits for each test vector of FIG. 4a (4 parallel input words times 10), 57 test vectors are required the produce the entire UTP (2,280 bits divided by 40 per vector). Therefore, 57 test vectors are provided for each pass through the UTP.

To test the SerDes component, the 57 test vectors that constitute the UTP are repeated and the UTP is repetitively generated. As the UTP is generated, the latching comparator 210 is activated to sample UTP at predetermined instants of time. Waveform 414 illustrates the LE signal at the Latch Enable input of the latching comparator 210. As shown, the tester repeats the LE signal twice during each test vector, or 114 times per UTP (57 vectors at twice per vector). After each pass through the 57 test vectors constituting the UTP, the timing position of the LE signal is incremented, so that the latching comparator 210 is made to sample a different portion of the UTP. In the preferred embodiment, to obtain the best possible timing resolution, the LE signal is incremented by one LSB of the tester's timing system on each successive pass through the UTP. In the Catalyst™ test system, manufactured by Teradyne Inc., of Boston, Mass, one LSB of the timing system equals 1 ns divided by 1,024, which approximately equals 9.76 ps. Therefore, on each successive pass through the UTP, the position of the LE signal is incremented by 9.76 ps. The process of sampling the UTP and incrementing the position of the LE signal is repeated until an entire desired portion of the UTP has been sampled.

Waveform 420 represents the data capture signal (CAP), which defines instants of time at which the tester 200 strobes a detector, such as detector 122, to sample the output of the latching comparator 210. When the detector is activated, its digital state is stored in the portion 216 of the memory 114. Because the latching comparator 210 holds its latched value indefinitely following the activation of the LE input, the precise timing of the CAP signal 420 is not critical. Care should be taken, however, to ensure that the CAP signal is asserted after the LE signal for the corresponding sample (following a sufficient delay to allow for setting times), and before a subsequent assertion of the LE signal. As shown in FIG. 4a, the tester activates the CAP signal 420 a short delay after the LE signal 418, in lockstep with the LE signal. Therefore, as the timing position of the LE signal 418 advances on successive passes through UTP 416, the timing position of CAP signal 420 is advanced correspondingly.

FIG. 4b is an exploded view of the UTP 416 and the LE signal 418 of FIG. 4a showing three consecutive bit regions of the UTP. In contrast with the waveforms of FIG. 4a, which represent one pass through the UTP, the waveforms of FIG. 4b represents numerous passes through the UTP. During the interval shown in FIG. 4b, the UTP segment 440 changes state twice, once at location 442 and once at location 444. Significantly, the locations of these changes of state do not occur at fixed, consistent instants of time, even though they are identically produced for all passes. The changes in position of the signal crossings are principally caused by jitter in the SerDes device. Because of jitter, the changes in state of the signal 440 may occur earlier or later than their average positions.

Waveform 446 represents LE signal across multiple passes through the UTP. As indicated above, assertions of the LE signal on successive passes are preferably separated by one LSB of the tester's timing resolution, or 9.76 ps in the Catalyst™ tester.

Figure 4C:
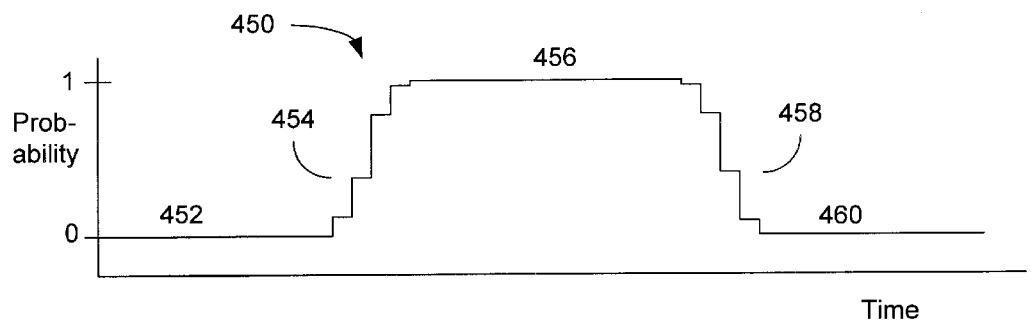
FIG. 4c is a probability function of the portion of the serial data stream shown in FIG. 4b.

FIG. 4c illustrates a probability function 450 of the UTP segment 440, for each instant at which the UTP segment 440 is sampled. During the portions 452 and 460 of the function 450, the probability function 450 consistently reports a low logic level. Similarly, during the portion 456, the probability function 450 consistently reports a high logic level. During the transition regions 442 and 444, however, the probability of the UTP segment 440 varies as a function of time. We have recognized that if the jitter in UTP segment 440 is distributed in a Gaussian fashion, the probability function 450 follows approximately s-shaped curves (shown as regions 454 and 458) during the transition regions 442 and 444.

The tester determines the probability function 450 by separately averaging the digital values (1's and 0's) acquired at the different sampled locations of the UTP, and rendering the averages as a function of time. In the preferred embodiment, the UTP is sampled 128 times. Therefore, 128 values are averaged for each sampled location. An alternative way of expressing the measurement results is as numbers that range from 0 to the number of samples per location (128). A location that renders all 1's would then produce a value of 128. One that renders all 0's would produce a value of 0. Those skilled in the art could readily devise numerous ways to express the probability function, and the specific manner used is not considered critical to the invention.

It is apparent from FIG. 4c that many timing characteristics of the UTP can be gleaned from the probability function 450. For example, jitter produced by the SerDes component can be directly determined from the widths of the transition regions 454 and 458. Differences between rising and falling jitter can be deduced from differences between the widths of the respective transition regions. As is known, "eye closure" is a significant characteristic of serial data streams. Eye closure is represented as a time between the transition regions 442 and 444 at which the signal 440 is guaranteed to be in a stable state. The segment 456 a FIG. 4c also represents this interval. If the width of the segment 456 shrinks to zero, the "eye" is said to have "closed," and data conveyed within that portion of the UTP cannot be reliably transmitted.

"Bit error rate" (BER) is another significant characteristic of serial data streams. The bit error rate of the serial data stream is the rate at which the data stream transmits invalid data due to jitter. To the extent that jitter can be modeled as a Gaussian phenomenon, the tails of the s-shaped regions 454 and 458 of the probability function 450 can be extrapolated mathematically to predict the probability that transmission errors will occur, at arbitrary distances from any given transition region. Therefore, using extrapolation, the above-described technique may also be used to determine bit error rate.

"Intersymbol interference" is defined as a repeatable change in an edge position of a serial data stream in response to previous logic levels produced within the serial data stream. The above-described technique can also be used to determine "intersymbol interference." Thermal characteristics, crosstalk, and stored charge contribute to intersymbol interference. Using the technique described above, one can measure intersymbol interference by noting the changes in the average edge positions in response to changes in preceding data (preceding 1's and 0's). The UTP is specifically designed to reveal intersymbol interference. Therefore, this error can generally be determined directly from the probability function 450.

The above-described technique can also be used to determine spectral components of intersymbol interference. According to this aspect of the technique, average edge positions within the serial data stream are compared with ideal, reference positions. The difference between the average and ideal edge position of each edge within the UTP is rendered as a function of time, and a Fast Fourier Transform (FFT) is performed on the resulting function. The spectrum of the function is specific to the particular device under test and can be used to diagnose defects.

Programming a Tester

Figure 5:
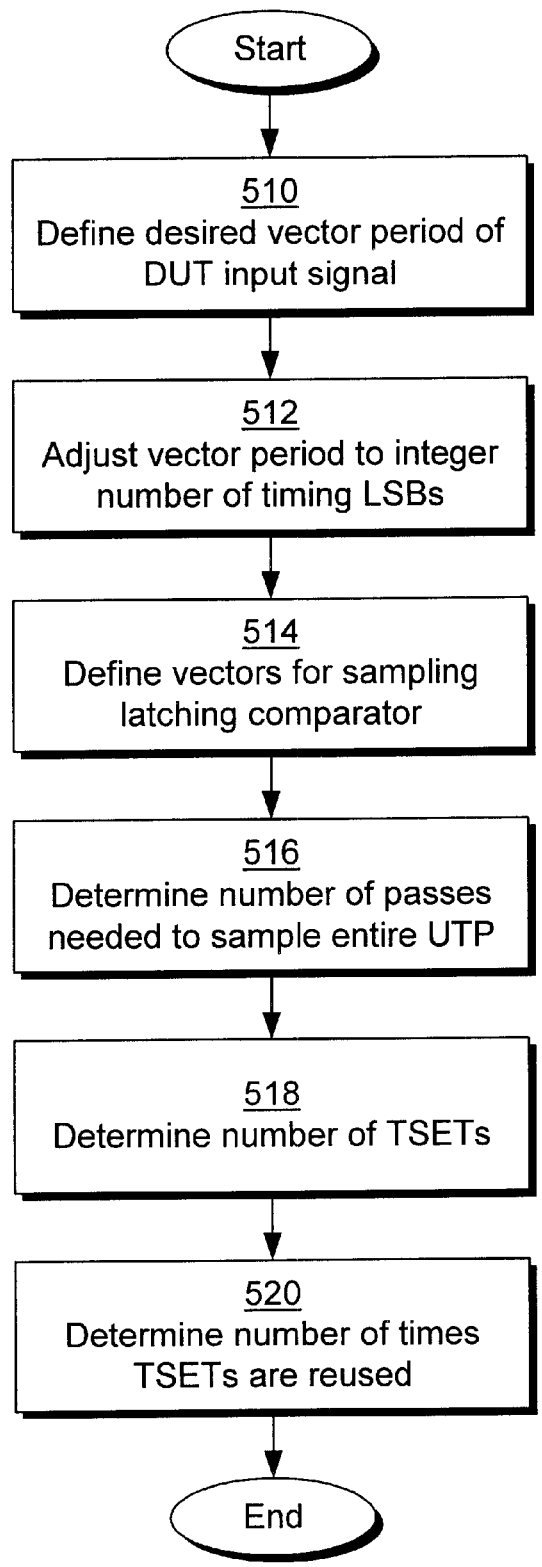
FIG. 5 is a flow chart illustrating a method for programming a tester to produce waveforms for testing serial data streams according to the invention.

The above-described method focuses generally on how a SerDes device can be sampled and evaluated according to the invention. FIG. 5 illustrates how this method can be implemented using an actual device tester.

Beginning at step 510, a test engineer defines a vector frequency for generating the data input words to the SerDes device at the requisite word rate. For example, to obtain a serial output bit rate of 2.5 Gbits, the word rate of the data input signals must be 250 MSa/s, one-tenth the bit rate of the serial output signal. If the tester is not capable of directly generating a vector frequency this high, alternative modes of signal generation should be considered. Various alternative modes of signal generation are known to those skilled in the art and include, for example, dual drive mode and mux mode. With dual drive mode, the frequency of a driver's output signal can be doubled by effectively combining the actions of two pin electronics channels within a single driver. With mux mode, the maximum frequency of the driver can also be doubled, by combining the outputs of two different drivers at a single output of a tester. By using both dual drive and mux mode simultaneously, a tester can produce waveforms at up to four times the maximum vector rate.

A vector frequency of 62.5 MHz is preferably selected when using the Catalyst™ test system from Teradyne Inc. Both dual drive and mux mode are used to generate the data inputs to the SerDes device. The Catalyst™ test system thus provides signals to the data inputs of the SerDes device that change at 250 MSa/s. Dual drive mode without mux mode is used for generating the clock signal for the SerDes component and for generating the LE signal for the latching comparator 210. These signals therefore change at a rate of 125 MHz.

At step 512, the vector period is adjusted so that each pass through the UTP corresponds to an integer number of tester timing LSB's. This step is required if all timing increments between successive assertions of the LE signal are to be uniform. If non-uniform spacing of the LE signals is tolerable, however, this step can be skipped. To ensure that each pass through the UTP constitutes and integer number of tester timing LSB's, it is sufficient that the period of the serial output signal of the SerDes device constitute an integer number of tester timing LSB's. For example, a SerDes output rate of 2.5 GSa/s corresponds to an output period of 400 ps, which comprises 40.96 tester timing LSB's in a Catalyst™ test system (1 LSB equals 10 ns/1,024). To ensure that each pass through the UTP constitutes an integer number of tester timing LSB's, this number should be rounded to the nearest integer (i.e., 41). Projecting back, 41 tester timing LSB's corresponds to an output period of 400.390625 ps, or a bit rate of 2.49756 GSa/s. This bit rate is extremely close to, but not precisely equal to, the desired SerDes output bit rate. Therefore, if uniform spacing of the samples is desired, a slight error in the SerDes bit rate may have to be tolerated. However, as the above numbers demonstrate, these errors are exceedingly small, and are expected to fall within allowable error budgets. If still greater accuracy is desired, the entire interval of a UTP—rather than the period of a single bit—can be rounded nearest integer number of tester timing LSB's. The rounding error would then be reduced by a factor equal to the number of bits in a UTP (a factor of 2,280 using the numbers provided above). Although distributing the rounding error over the entire UTP renders a more accurate result, it is actually less preferred because it causes the bits of the UTP and the samples to change their relative alignment from bit to bit of the UTP. When each bit of the UTP contains an integer number of tester timing LSBs, all bits of the UTP are sampled at the same relative positions.

At step 514, the test engineer defines test vectors for sampling the output of the SerDes component via the latching comparator 210. It should be noted that the tester's ability to effectively sample the SerDes output signal is not limited by the tester's maximum data rate, because the UTP can be repeated indefinitely until all desired timing locations have been sampled. The tester's data rate does play an important role, however, in determining measurement time. To minimize measurement time and maximize throughput, the highest practical data rate should be used. The Catalyst™ test system uses dual drive mode to generate the LE signal and for sampling the latching comparator 210. We have determined that mux mode may introduce timing skew between adjacent edges under some circumstances. As the LE signal is especially time-critical, mux mode is preferably not used for generating the LE signal. With a vector frequency of approximately 62.5 MHz, therefore, the LE signal is asserted at approximately 125 MHz.

At step 516, the test engineer determines the number of passes through the UTP needed to sample the entire pattern. If the UTP consists of 57 test vectors sampled using dual drive mode, then one pass through the UTP causes 114 different samples to be taken. As there are 2,280 bits in a UTP, each including 41 tester timing LSB's (see step 512), then one UTP includes a total of 93,480 tester timing LSB's (2,280 bits times 41 LSB's per bit). Dividing this total by 114 samples per UTP gives the number of passes needed to sample each point within the UTP, or 820 passes. Therefore, using the values indicated, the UTP should be repeated 820 times to acquire one sample at each timing location.

And is known, component testers generally provide a limited number of timing sets ("TSETs") for generating digital bursts. Each TSET is generally defined by a clock period, and assert time, and a return time. One signal edge defined by TSET generally occurs at the assert time, and another edge generally occurs at the return time. Therefore, a TSET effectively defines a digital waveform having a predetermined period and high and low digital states that occur at predetermined, programmable instants in time. By changing the assert and return times of a TSET, signal edges can be moved in time with respect to the test vector (i.e., T0). Signal edges can also be moved by applying different TSETs. In the preferred embodiment, TSETs are used to control the timing of the LE signal, and to increment its timing to coincide with different portions of the UTP 416.

Preferably, one group of TSETs is used for each pass through the UTP. To complete 820 passes though the UTP, each providing a different timing location of the LE signal, the TSETs must be reprogrammed or reused 820 times. No known component tester provides 820 different TSETs. Therefore, to complete 820 passes, TSETs will need to be reused. How many TSETs will be used, and how often they will to be reused, must then be determined.

At step 518, the test engineer determines the number of TSETs that will be used. Generally, there is no time penalty incurred by changing from one pre-programmed TSET to another as a test program is executed. Substantial time is required, however, by reprogramming TSETs to new values. Because this time extends test time and decreases throughput, TSETs should preferably be reprogrammed as infrequently as practical. This concern must be weighed, however, against the need for simplifying tester software. We have recognized that tester software can be greatly simplified by using a number of TSETs that is divisible by the number of passes through the UTP (820). We have found that a good compromise in a Catalyst™ tester between maximizing throughput and simplifying tester software is to use 20 different TSETs.

At step 520, the test engineer determines how many times the number of TSETs determined in step 518 must be reprogrammed. This number equals the number of passes (820) divided by the number of different TSETs (20), or 41 times, using the values indicated above.

To determine average values of the SerDes output signal at each timing location, a single TSET is programmed with constant values and multiple passes are made through the UTP. For example, to obtain the preferred number of samples (128), the TSET for asserting the LE signal is repeated 128 times. To sample all locations of the UTP 128 times, each of the 820 passes is repeated 128 times. A total of 104,960 passes (820 passes times 128) are therefore completed through the UTP to obtain the desired number of samples at each point. As each pass lasts for approximately 912 ns (2,280 bits at approximately 400 ps per bit), approximately 95.7 ms (104,960 times 912 ns) are required to complete the total number of passes.

In the Catalyst™ tester, the total time required for testing and evaluating a UTP is approximately 500 ms. This includes not only sampling time, but also time for reprogramming TSETs and for processing the captured data. In the preferred embodiment, the host computer 110 processes the data by reading detector values from the memory segment 216 of the memory 114, where captured values of the serial data stream have been stored, and performing calculations on the stored data.

Alternatives

Having described one embodiment, numerous alternative embodiments or variations can be made. For example, in the above description the Catalyst™ tester is used for implementing the system and process for capturing and evaluating serial data. However, this is merely an example. A wide variety of different testers could be employed, and are known to those skilled in the art.

In addition, the system and process for testing serial data streams is described above with reference to SerDes components. However, the invention could also be applied for testing other types of electronic components. For example, the invention could be used for testing standalone clock recovery circuits, which are now being developed with serial outputs having comparable data rates.

Moreover, different timing characteristics of the device under test from those described above (i.e., jitter, eye closure, bit error rate, and intersymbol interference) can be evaluated using the general methodology described above.

Specific values of resolution, operating frequency, and other characteristics of test system and device under test are disclosed above for illustrative purposes and are not intended to limit the scope of the invention described. For example, the test system need not be operated at the limit of its timing resolution. Rather, resolution can be varied as desired to suit the particular testing problem. The resolution can be an integer multiple of the tester timing LSB's, or an arbitrary value numerically unrelated to the tester timing LSB.

Moreover, the test engineer has been included as an agent for performing many of the procedural steps described above. Given the trend toward automation, however, these steps should not be interpreted as requiring a test engineer. Those skilled in the art could readily devise ways of automating the tasks herein assigned to the test engineer as part of the normal course of improving their processes.

It should be understood, therefore, that the invention may be practiced in a variety of different ways, and should be limited only by the spirit and scope of the appended claims.

What is claimed is:

1. A method for testing a device under test (DUT) that generates a serial data stream, comprising the steps of:
    A) repetitively sampling the serial data stream at a fixed timing location relative to the serial data stream;
    B) averaging the samples acquired in step A to determine a probability of the serial data stream at the fixed timing location; and
    C) repeating steps A and B at a different fixed timing locations relative to the serial data stream, to render a probability function of the serial data stream versus time.

2. The method as recited in claim 1, further comprising:
    D) evaluating the probability function rendered in step C to determine timing characteristics of the DUT.

3. The method as recited in claim 2, wherein the evaluating step comprises determining widths of transition regions in the probability function, said widths being indicative of jitter in locations of bit transitions of the serial data stream.

4. The method as recited in claim 2, wherein the evaluating step comprises determining locations of transition regions in the probability function, said locations being indicative of intersymbol interference of the serial data stream.

5. The method as recited in claim 2, wherein the evaluating step includes examining spectral components of intersymbol interference in the serial data stream.

6. The method as recited in claim 5, wherein the step of examining the spectral components of intersymbol interference comprises:
    determining a difference between the location of each bit transition of the serial data stream and the respective ideal location of the bit transition;
    rendering the differences for all bit transitions as a function of time; and
    performing a Fast Fourier Transform (FFT) on the difference function.

7. The method as recited in claim 6, further comprising diagnosing the DUT as passing or failing responsive to spectral components of the FFT.

8. The method as recited in claim 2, wherein the serial data stream is a Unit Test Pattern (UTP) defined for testing SerDes devices.

9. The method as recited in claim 1, performed by a component tester running a test program.

10. The method as recited in claim 9, wherein the step of sampling comprises the component tester activating a latching device to acquire the state of the serial data stream.

11. The method as recited in claim 10, wherein the DUT is converts parallel data words into the serial bit stream, and further comprising the tester applying a plurality of input signals to the DUT to induce the DUT to generate the serial data stream.

12. A method of programming a tester to capture a serial data stream from the output of a SerDes device, comprising:
    A) determining a vector period to be used for applying input data to the SerDes device at a desired word rate;
    B) computing a number (P) of times the serial data stream must be repeated to sample each desired location of the serial data stream using the vector period determined in step A;
    C) determining an integer number (N) of tester timing sets (TSETs) to be used in sampling all desired locations of the serial data stream, wherein N is divisible by P;
    D) determining an integer number (M) of times said N TSETs are to be reused in sampling the serial data stream, wherein M equals P divided by N; and
    E) programming the tester with the vector period, test vectors, number of TSETs, and number of times the TSETs are reused.

13. The method as recited in step 12, further comprising adjusting the vector period determined in step A so each bit of the serial data stream lasts for an integer number of tester timing LSB's.

14. The method as recited in claim 12, wherein the tester has a maximum data rate, and the step E of programming the tester includes applying at least one alternative signal generation technique for generating test signals faster than the maximum data rate of the tester.

15. The method as recited in claim 12, further comprising defining test vectors for sampling the serial data stream from the output of the SerDes device.

16. In an automatic test system, an apparatus for testing a device under test (DUT) that generates a serial output signal, comprising:
    a plurality of driver circuits, a portion of said plurality of driver circuits being coupled to the DUT to stimulate the DUT to generate a serial output signal;
    a latching device having a signal input coupled to the output of the DUT for receiving the serial output signal, an enable input coupled to one of the plurality of driver circuits for activating the latching device, and an output coupled to a memory for storing digital values provided at the output of the latching device;
    a timing generator for causing the driver circuit coupled to the enable input of the latching device to activate the enable input at predetermined instants of time relative to the serial output signal; and
    means for determining a probability of the serial output signal from the stored values.

17. The apparatus as recited in claim 16, wherein the latching device comprises a comparator having at least one input coupled to the output of the DUT and an output coupled to a latching circuit.

18. The apparatus as recited in claim 16, wherein the latching device is a latching comparator.

19. The apparatus as recited in claim 16, wherein the DUT is a SerDes device that receives input words in parallel format and generates output bits in serial format.

20. The apparatus as recited in claim 16, wherein the means for determining the probability comprises a host computer executing a test program.

* * * * *